United States Patent
Aoki et al.

(10) Patent No.: US 7,592,266 B2
(45) Date of Patent: Sep. 22, 2009

(54) REMOVING SOLUTION, CLEANING METHOD FOR SEMICONDUCTOR SUBSTRATE, AND PROCESS FOR PRODUCTION OF SEMICONDUCTOR DEVICE

(75) Inventors: Hidemitsu Aoki, Kanagawa (JP); Hiroaki Tomimori, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/939,575

(22) Filed: Nov. 14, 2007

(65) Prior Publication Data
US 2008/0066779 A1 Mar. 20, 2008

Related U.S. Application Data

(62) Division of application No. 10/350,185, filed on Jan. 24, 2003, now Pat. No. 7,312,160.

(30) Foreign Application Priority Data
Jan. 24, 2002 (JP) ............................. 2002-015887

(51) Int. Cl.
*H01L 21/302* (2006.01)
(52) U.S. Cl. ............... 438/745; 438/693; 257/E21.309; 134/4; 451/41; 451/60
(58) Field of Classification Search ................. 438/686, 438/693, 745; 134/4; 451/41, 60; 257/E21.309
See application file for complete search history.

(56) References Cited

U.S. PATENT DOCUMENTS

| | | | |
|---|---|---|---|
| 5,714,407 A * | 2/1998 | Maeno et al. ............... | 438/701 |
| 5,725,414 A | 3/1998 | Moinpour et al. | |
| 5,958,288 A | 9/1999 | Mueller et al. | |
| 6,117,783 A | 9/2000 | Small et al. | |
| 6,127,258 A | 10/2000 | Watanabe et al. | |
| 6,190,237 B1 | 2/2001 | Huynh et al. | |
| 6,217,416 B1 | 4/2001 | Kaufman et al. | |
| 6,245,650 B1 | 6/2001 | Watanabe | |
| 6,376,345 B1 | 4/2002 | Ohashi et al. | |
| 6,383,065 B1 | 5/2002 | Grumbine et al. | |
| 6,475,407 B2 | 11/2002 | Ono | |
| 6,527,622 B1 | 3/2003 | Brusic et al. | |
| 6,589,872 B1 | 7/2003 | Twu et al. | |
| 6,638,143 B2 | 10/2003 | Wang et al. | |
| 6,706,422 B2 | 3/2004 | Inoue et al. | |
| 2002/0004360 A1 | 1/2002 | Ota et al. | |
| 2002/0018896 A1 | 2/2002 | Fukunaga et al. | |
| 2002/0077035 A1 | 6/2002 | Wang et al. | |
| 2003/0116444 A1 | 6/2003 | Basol | |

FOREIGN PATENT DOCUMENTS

| | | |
|---|---|---|
| EP | 1055463 A2 | 11/2000 |
| JP | 2001-237389 | 8/2001 |
| JP | 2001-345303 | 12/2001 |
| WO | WO 01/84621 A1 | 11/2001 |

\* cited by examiner

OTHER PUBLICATIONS

Wolf et al., "Silicon Processing for the VLSI Era," vol. 1, Proc. Tech., pp. 761-762, 782-785 (2000).

*Primary Examiner*—Laura M Menz
*Assistant Examiner*—Colleen E Snow
(74) *Attorney, Agent, or Firm*—Young & Thompson (57) ABSTRACT

The removing solution containing a cerium (IV) nitrate salt, periodic acid or a hypochlorite can be applied to metals containing copper, silver or palladium and also to metals containing other metals having a relatively large oxidation-reduction potential.

8 Claims, 5 Drawing Sheets

REMOVING SOLUTION, CLEANING METHOD FOR SEMICONDUCTOR SUBSTRATE, AND PROCESS FOR PRODUCTION OF SEMICONDUCTOR DEVICE

BACKGROUND OF THE INVENTION

1. Field of the Invention

The present invention relates to a removing solution for removing metals containing copper, silver or palladium, a washing method for a semiconductor substrate using the removing solution, and a process for producing a semiconductor device.

2. Description of the Related Art

The requirement for high-speed operability of semiconductor device has increased year by year, and currently copper of low resistance is in wide use as a wiring material. Copper alone has low resistances to electromigration and stress migration and tends to cause disconnection when a fine wiring is employed. However, by adding, for example, tin (Sn), zirconium (Zr) or silver (Ag), resistances to electromigration and stress migration can be enhanced. As for silver which has a lower resistance than copper, its use as a main component of a wiring material is being investigated.

Copper and silver have a property of low resistance; however, they may incur metal contamination which results in reduced reliability of device, in a process for formation of semiconductor device. A countermeasure for such metal contamination is an important technical task.

When silver or copper is used as a wiring material, metal contaminants of silver, copper, their compounds, etc. adhere to the back side of substrate, etc. in a metal layer formation step and a processing step. In the subsequent heat treatment step, such metal contaminants diffuse through the substrate and reach its device area, deteriorating the properties of the device and causing current leakage. The diffusion of metal contaminants appear strikingly when the heat treatment is conducted at a high temperature of, for example, 300° C. or more. Further, when a semiconductor substrate is transferred in a carrier system that metal contaminants have adhered to the substrate, cross-contamination of film-forming apparatus takes place.

Thus, when a step of forming a metal layer containing silver or copper is included, it is desired to wash the back side, etc. of substrate to a highly clean state.

However, metal contaminants including silver, copper and compounds thereof adhere to a silicon substrate strongly in some cases and are generally difficult to remove. Further, in order to efficiently remove metal contaminants adhering to a silicon substrate, it is desired to not only dissolve the metal contaminants but also effectively prevent readhesion of the dissolved metal contaminants to the silicon substrate.

The present invention has been made in view of the above situation and aims at providing a removing solution which can dissolve and remove metal contaminants such as silver, copper and the like sufficiently and further can highly prevent readhesion of the dissolved metal contaminants, and a washing method for a semiconductor substrate.

SUMMARY OF THE INVENTION

According to the present invention there is provided a removing solution for removing metals containing a metal having an oxidation-reduction potential of 0.3 to 1.0, which contains a cerium (IV) nitrate salt, periodic acid or a hypochlorite. Here, the metal having an oxidation-reduction potential of 0.3 to 1.0 is at least one metal selected from the group consisting of copper, silver, rhodium and palladium.

Further, the metal having an oxidation-reduction potential of 0.3 to 1.0 includes a simple substance of copper, silver or palladium and/or an alloy containing copper, silver or palladium in an amount of 1 to 99 weight %. As examples of the alloy, there can be mentioned a Cu—Ag alloy, a Cu—Zr (zirconium) alloy and a Cu—Cr alloy. When the metal is a Cu—Ag alloy, the content of silver may be 0.001 to 99.999%. Also, palladium may be one contained in a treating solution used as a metal cap before plating.

The hypochlorite is preferably a salt of hypochlorous acid and a strong alkali. The hypochlorite can be, for example, sodium hypochlorite. In this case, however, sodium acts on the device region of semiconductor substrate and may damage the reliability of the device; therefore, care is preferably taken so that the removing solution does not act on the device-formed area.

The cerium (IV) nitrate salt is desirably cerium (IV) nitrate ammonium.

The removing solution may be used for removal of metals adhering to a semiconductor substrate. The removing solution may be used for washing of the area of semiconductor substrate other than its device region, having metals adhering thereto. The "area of semiconductor substrate other than its device region" refers to an area including the ends and back side of semiconductor substrate and the periphery of each device region. The semiconductor substrate may be a silicon substrate.

The removing solution may further contain at least one acid selected from the group consisting of nitric acid, acetic acid, iodic acid and chloric acid. The removing solution may contain a cerium (IV) nitrate salt, periodic acid or a hypochlorite and an acid component in amounts of 10 to 30 weight and 5 to 30 weight %, respectively, relative to the total.

According to the present invention, there is also provided a removing method for removing metals containing copper, silver, rhodium or palladium, using the removing solution mentioned above. That is, there is provided a method for cleaning, etching, etc. of metals containing copper, silver, rhodium or palladium. In this case, the metals desirably contain at least one metal selected from the group consisting of copper, silver, rhodium or palladium, in an amount of 90% or more.

According to the present invention, there is also provided a method for using a removing solution, which comprises conducting a removing treatment using the above-mentioned removing solution and then, in order to remove the residue of the removing solution, conducting cleaning using a semiconductor substrate cleaning solution containing hydrofluoric acid.

According to the present invention there is also provided a cleaning method for a semiconductor substrate, which comprising;

a step of forming, on a semiconductor substrate, a metal layer containing copper, silver or palladium, and a step of removing a metal adhering to the above semiconductor substrate using a removing solution containing a cerium (IV) nitrate salt, periodic acid or a hypochlorite.

When such cleaning is conducted, as compared with when a treatment such as etching or the like is conducted, a high ability is required for prevention of readhesion of the cleaned and removed metal contaminants. The removing solution of the present invention has an excellent ability for prevention of such readhesion; therefore, the solution can be preferably used for the above cleaning also from such a standpoint.

The cerium (IV) nitrate salt desirably consists of cerium (IV) nitrate ammonium.

The method further comprise, after the removing step, a step for washing the semiconductor substrate using a semiconductor substrate cleaning solution containing hydrofluoric acid.

The removing step may be conducted by keeping the semiconductor substrate approximately horizontal and rotating it, and spraying the removing solution on a predetermined area of the semiconductor substrate to remove the metal adhering to the area of the semiconductor substrate other than its device-formed area.

According to the present invention, there is provided a process for producing a semiconductor device, which comprising;

a step of forming an insulating film on a semiconductor substrate, a step of forming a dent in the insulating film, a step of forming, on the whole surface of the semiconductor substrate and so as to bury the dent, a metal film containing at least one metal selected from the group consisting of copper, silver, rhodium or palladium, a step of removing a metal adhering to the area of the semiconductor substrate other than its device-formed area using a removing solution containing a cerium (IV) nitrate salt, periodic acid or a hypochlorite, and a step of removing, in the device-formed area, the metal film formed except in the dent.

This process may further comprise, after the step of removing the metal film formed except in the dent, a step of removing the metal adhering to the area of the semiconductor substrate other than its device region. This process may further comprise, after the step of removing the metal adhering to the area of the semiconductor substrate other than its device region, a step of cleaning the semiconductor substrate using a semiconductor substrate cleaning solution containing hydrofluoric acid.

Thus, a cerium (IV) nitrate salt, periodic acid or a hypochlorite has an excellent ability for removal of metal contaminants containing copper, silver or palladium and further can effectively prevent readhesion of the removed metal contaminants. This is a new finding and the present invention has been completed based on the finding.

DETAILED DESCRIPTION OF THE INVENTION AND PREFERRED EMBODIMENTS

The removing solution containing a cerium (IV) nitrate salt, periodic acid or a hypochlorite can be applied to metals containing copper, silver or palladium and also to metals containing other metals having a relatively large oxidation-reduction potential. As an example thereof, there can be mentioned metals containing Rh (rhodium), Ir (iridium), Pt, etc.

The oxidation-reduction potentials of these metals, copper, silver and palladium are shown below.

$Cu(2+)/Cu\ 0.34$ $Rh(3+)/Rh\ 0.758$ $Ag(1+)/Ag\ 0.7991$ $Pd(2+)/Pd\ 0.915$ $Ir(3+)/Ir\ 1.156$ $Pt(2+)/Pt\ 1.188$

The above removing solution can remove particularly well, of these metals, copper, rhodium, silver and palladium which are metals having an oxidation-reduction potential of 0.3 to 1.0. The metals to be removed are preferably those having a resistivity of, for example, about $2.7 \times 10^{-6}$ $\Omega$cm (equivalent to that of aluminum) or less. Such a metal can be effectively used as a wiring material in replace of aluminum.

Figure 1:
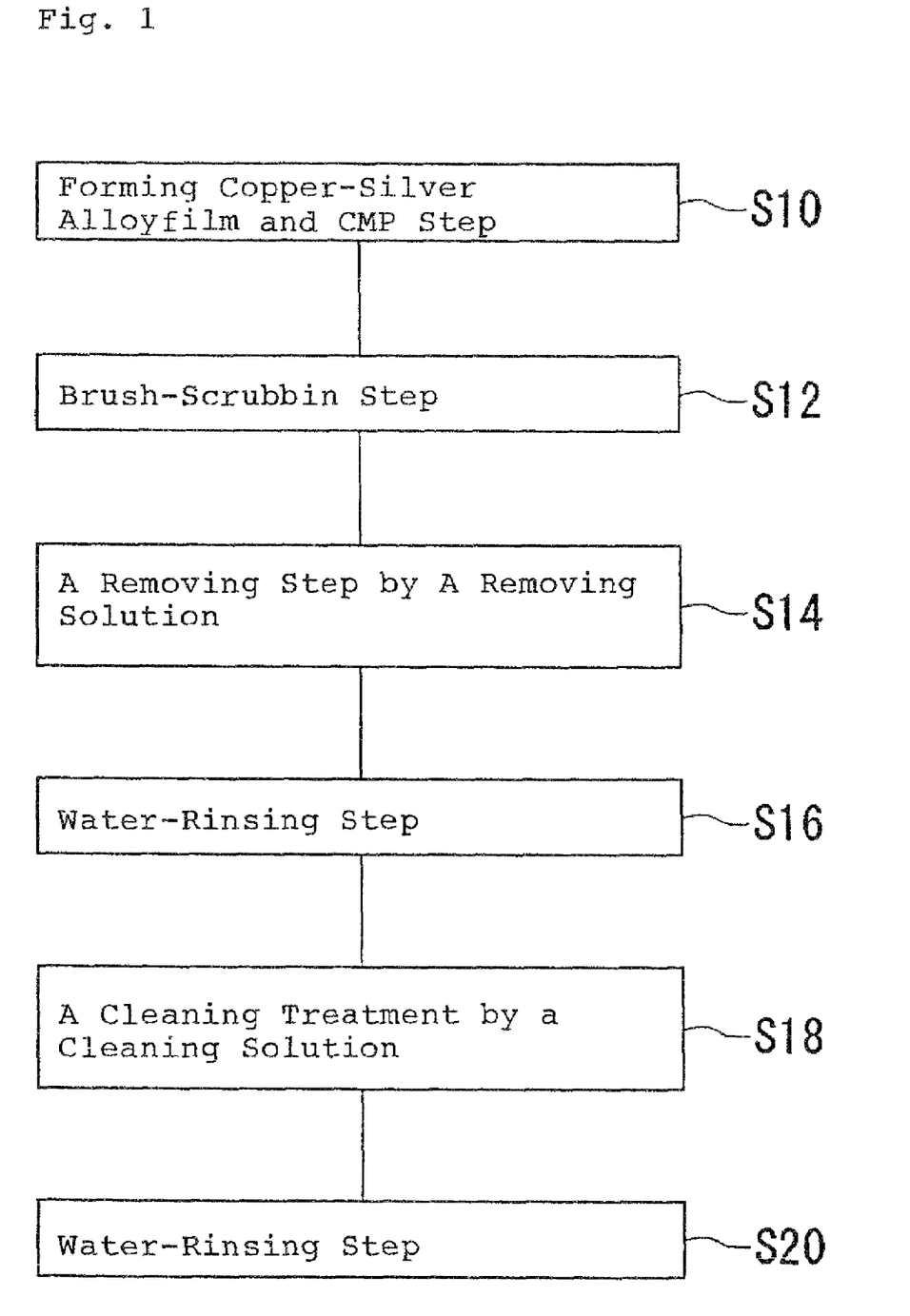
FIG. 1 is drawings showing an example of steps for washing treatment of semiconductor substrate, according to an embodiment of the present invention.
Figure 2:
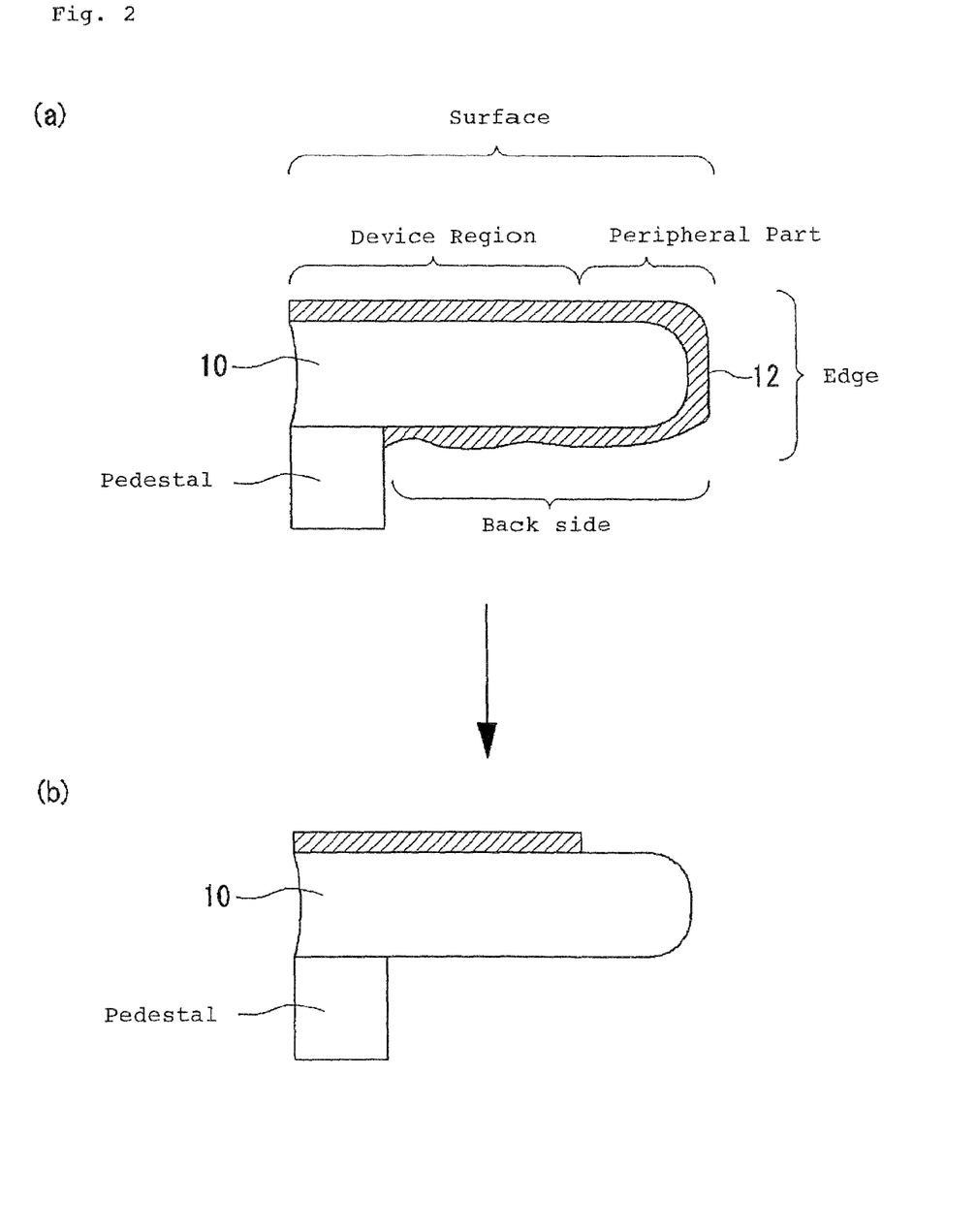
FIG. 2 is drawings showing a semiconductor substrate after formation of a copper-silver layer.

FIG. 1 is drawings showing steps for cleaning treatment of semiconductor substrate according to an embodiment of the present invention. For example, when formation of a copper-silver alloy film by plating or the like and subsequent processing treatment such as CMP (chemical mechanical polishing) procedure or the like are made on a semiconductor substrate at the device region, copper-based and silver-based metal contaminants adhere to the semiconductor substrate (S10). FIG. 2(a) shows a state in which particulate and filmy metal contaminants 12 of copper, silver, copper-oxide, silver oxide, etc. have adhered to the back side and ends of a semiconductor substrate 10, the periphery of the substrate surface (the substrate surface area other than the device region) and the ends of the substrate.

For example, when a processing treatment such as CMP procedure or the like has been conducted, not only metal contaminants but also abrasive particles contained in slurry remain on a semiconductor substrate 10; therefore, these residues are removed by appropriately conducting a brush-scrubbing step (S12). Then, a removing step by a removing solution is conducted to remove particulate and filmy metal contaminants adhering to the semiconductor substrate 10 (S14). Successively, a pure water-rinsing step is conducted (S16). That is, water is sprayed on the semiconductor substrate 10 to conduct water washing. Thereby, the precipitation of removing solution, etc. can be removed. Incidentally, this step is preferably conducted by spin cleaning from the standpoint of removal efficiency.

Next, a cleaning treatment by a semiconductor substrate cleaning solution is conducted to wash a residue of the removing solution (S18). Successively, a pure water-rinsing step is conducted (S20). Thereby, the semiconductor substrate cleaning solution containing the removing solution dissolved therein can be removed completely. Then, nitrogen blowing or the like is made to dry the semiconductor substrate 10, whereby the washing treatment is completed. By the above-mentioned steps, the metal contaminants adhering to the area of the semiconductor substrate 10 other than its device region can be removed as shown in FIG. 2(b).

<Brush-Scrubbing>

Next, the brush-scrubbing step of step 12 is explained in detail. The brush-scrubbing is conducted, for example, by, as shown in FIG. 3, keeping a semiconductor substrate 10 between a pair of brushes 20, rotating, in that state, the semiconductor substrate 10, and dropping a semiconductor substrate cleaning solution on the surface and back sides thereof.

Figure 3:
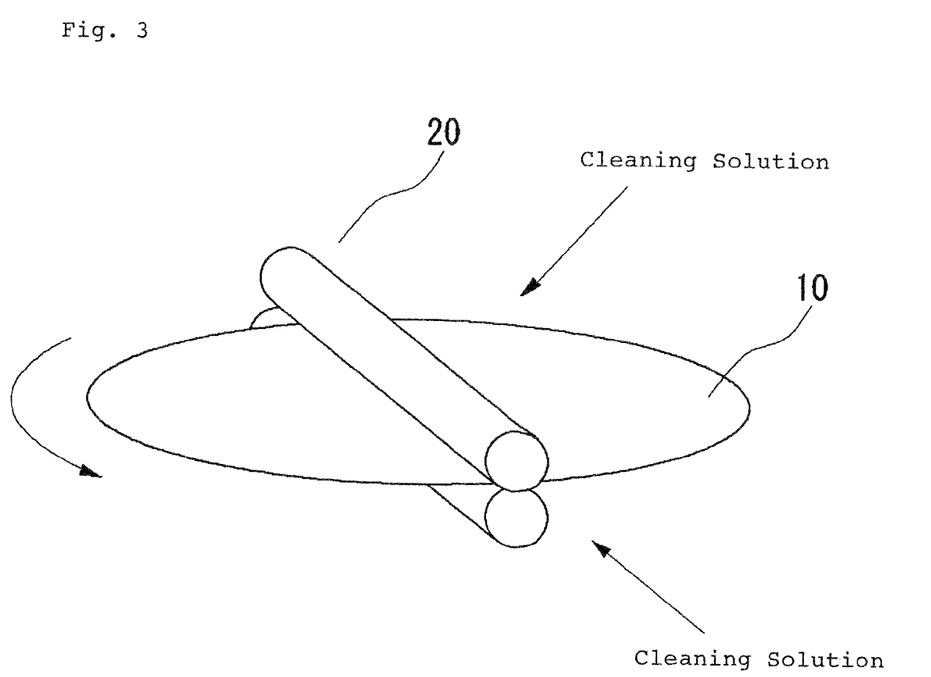
FIG. 3 is a drawing showing a brush-scrubbing step.

Incidentally, besides a roll type brush shown in FIG. 3, a disk type brush may be used. The feeding of the semiconductor substrate cleaning solution can be conducted by dropping the solution on the brush or dropping the solution on the wafer in the vicinity of the brush. Or, the feeding may be conducted into the brush.

As the semiconductor substrate cleaning solution used in the brush-scrubbing step, there can be used pure water, ammonia water, electrolytic cathode water, a hydrogen-dissolved water, etc. The semiconductor substrate cleaning solution may contain as necessary additives such as surfactant and the like. Here, the electrolytic cathode water refers to a solution generated at a cathode side when pure water or water containing a small amount (0.5 weight % or less) of ammonium ion is electrolyzed. As an apparatus for obtaining the electrolytic cathode water, a two-cell or three-cell type electrolyzer is used generally. The hydrogen-dissolved solution refers to an aqueous solution obtained by dissolving hydrogen in pure water or in water containing a small amount (0.5% by mass or less) of ammonium ion. In order to dissolve hydrogen, bubbling or the like is used.

<Removing Treatment>

Next, the removing treatment of step 14 is described in detail. In the present embodiment, a removing solution is used for removal of metal contaminants generated during formation of a copper-silver alloy film. Here, description is made on a case of a copper-silver alloy; however, the removing solution is usable also for removal of metal contaminants generated during formation of a film of copper-containing metals, silver alone or silver-containing metals.

In the present embodiment, the removing solution contains a salt of tetravalent cerium ion. As the salt of tetravalent cerium ion, there can be mentioned ceric nitrate ammonium, ceric nitrate potassium, etc. Of these, ceric nitrate ammonium is used preferably because it gives a small adverse effect on device properties.

When ceric nitrate ammonium is used as the removing solution, copper-based and silver-based metal contaminants can be dissolved efficiently, and metal contaminants adhering to a substrate can be removed effectively. Further, since the removing solution can sufficiently remove copper-based and silver-based metal contaminants even at room temperature of about 25° C., the heating of the removing solution is unnecessary, Whereby advantages are obtained in that an incidental facility for removing treatment is simplified and the life of the removing solution is extended. Furthermore, deposition of cerium after removing treatment can be suppressed at a relatively small amount; therefore, subsequent washing allows the substrate to have a sufficiently clean surface.

The removing solution may further contain at least one acid selected from the group consisting of nitric acid, acetic acid, iodic acid and chloric acid. The acid used here is preferably nitric acid or acetic acid, most preferably nitric acid. By using such an acid in combination with a ceric nitrate ammonium component, the removing solution has higher stability and higher dissolving power for metal contaminants.

In the removing solution, the content of the ceric nitrate ammonium component is preferably 5 weight % or more, more preferably 10 weight % or more. Thereby, metal contaminants can be dissolved and removed sufficiently. Moreover, readhesion of the removed metal contaminants can be prevented. The upper limit of the content of the ceric nitrate ammonium is preferably 30 weight % or less. Thereby, deposition of the ceric nitrate ammonium component can be prevented effectively.

In the removing solution, the content of the acid component is preferably 1 weights or more, more preferably 5 weights or more. Thereby, the solubility of metal contaminants in removing solution is increased; as a result, the metal contaminants can be dissolved and removed sufficiently and, further, readhesion of the removed metal contaminants can be prevented. The upper limit of the content is not particularly restricted but is, for example, 30 weights or less.

In the present embodiment, the removing solution shows an synergistic effect obtained by a combined use of the ceric nitrate ammonium component and the acid component and, as a result, exhibits a high-level removability for metal contaminants and a high-level preventability for readhesion of removed metal contaminants.

Preferably, the removing solution further contains water. By employing such a constitution, the metal contaminants removability of the removing solution is exhibited more effectively. The removing solution may contain, in place of the water component, water and a water-soluble organic solvent. As the water-soluble organic solvent, a solvent miscible with water and other components used in the present embodiment can be used. The removing solution may furthermore contain other components such as surfactant and the like.

The removing solution is intended to remove metal contaminants adhering to the area of semiconductor substrate other than its device region. Therefore, in conducting a removing treatment, it is desired that care is taken in order for the removing solution not to adhere to the device region. Description is made below on a method for conducting such a treatment, with referring to FIG. 3 and FIG. 4.

Figure 4:
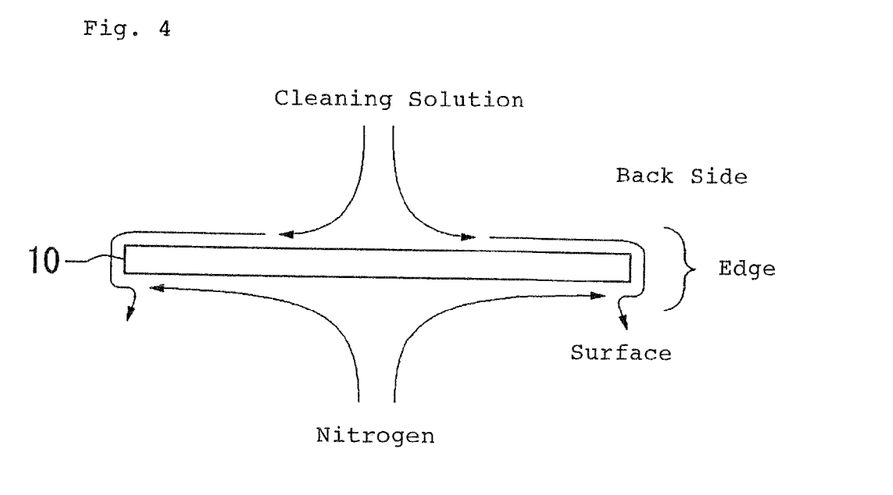
FIG. 4 is a schematic drawing showing an example of spin cleaning.

FIG. 4 is a schematic drawing showing an example of spin cleaning. In this example, a gas is blown on the surface of a semiconductor substrate 10 to prevent adhesion of a removing solution to the device region of the substrate. While the semiconductor substrate 10 is rotated, a gas such as nitrogen or the like is blown on the surface and simultaneously a removing solution is dropped to the back side of the substrate. By spraying the gas on the surface of the semiconductor substrate 10, the reaching of the removing solution to the ends of the substrate is suppressed and the device region is protected. As the gas, an inert gas such as nitrogen or the like can be used.

Figure 5:
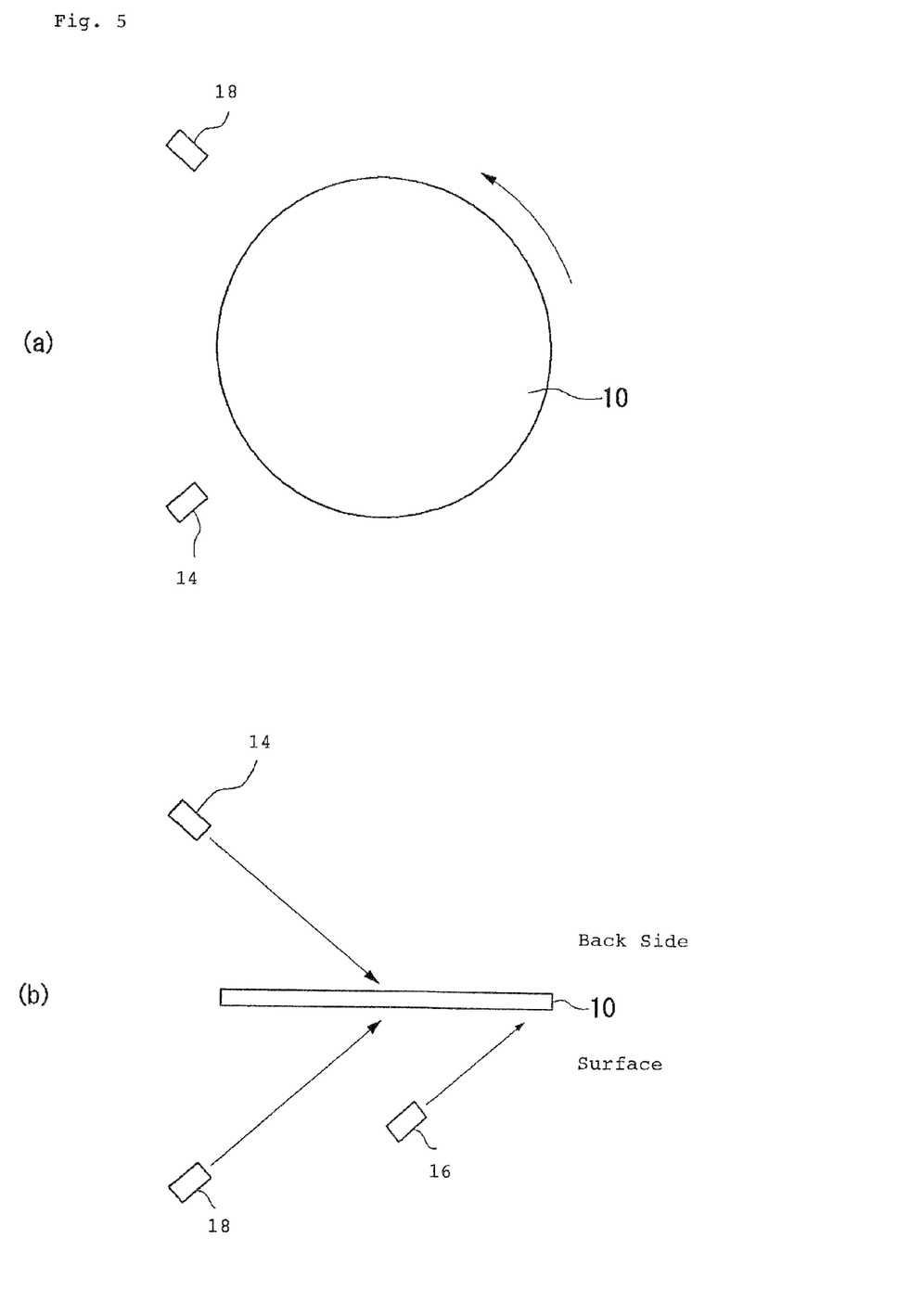
FIG. 5 is a schematic drawing showing an example of spin cleaning.

FIG. 5 is a schematic drawing showing an example of spin cleaning. In this example, a liquid is sprayed on the surface of a semiconductor substrate 10 to prevent adhesion of a removing solution to the semiconductor device region of the substrate. While the semiconductor substrate 10 is rotated, a removing solution is sprayed from a back side nozzle 14 and an end nozzle 16 and simultaneously a liquid is sprayed on the surface from a surface nozzle 18. Thereby, the arrival of the removing solution at the device region can be prevented. As the liquid sprayed from the surface nozzle 18, a liquid giving no damage to the device-formed area is used and, for example, pure water is used.

By the above method, the arrival of the removing solution at the device-formed area can be prevented and the damage of the copper-silver alloy film formed at the device portion can be prevented.

<Cleaning Treatment>

Next, in-depth description is made on the cleaning treatment of step 18. In the present embodiment, the semiconductor substrate cleaning solution contains, for example, hydrofluoric acid, diluted hydrofluoric acid, or a mixed solution of diluted hydrofluoric acid and nitric acid. In the semiconductor substrate cleaning solution, the content of the hydrofluoric acid component is preferably 0.5 to 5 weight % and the content of the nitric acid is preferably 5 to 20 weight %. By this treatment, a residue (e.g. a cerium nitrate salt) depositing and remaining on a semiconductor substrate can be dissolved and removed efficiently and, moreover, readhesion of the removed cerium nitrate salt can be prevented. By cleaning and removing the residue, cross-contamination between apparatus (es) and wafers can be prevented effectively and an improvement in yield and a further improvement in reliability of device can be achieved. The cleaning treatment by the semiconductor substrate cleaning solution, similarly to the above-mentioned removing treatment, is preferably conducted using a method such as spin cleaning or the like, with the device-formed area of semiconductor substrate 10 being protected.

The above-mentioned cleaning process is a preferred cleaning process. However, the brush-scrubbing step of step 12 and the pure water-rinsing steps of 16 and step 20 can be omitted as necessary.

In the present embodiment, as the semiconductor substrate, there can be mentioned a silicon substrate, a III-V group compound (e.g. GaAs, InP or GaN) semiconductor substrate and a II-VI group compound (e.g. ZnSe) semiconductor substrate. The removing solution used in the present embodiment is particularly suitable for use in the treatment of a silicon substrate of the above substrates. The removing solution used in the present embodiment has excellent removability for metal contaminants and therefore can remove metal contaminants even when the metal contaminants are copper-based and silver-based metal contaminants strongly adhering to a silicon substrate and diffusion of such metal contaminants into substrate can be prevented. Thereby, deterioration of device properties can be prevented.

<Process for Wiring Production>

Figure 6:
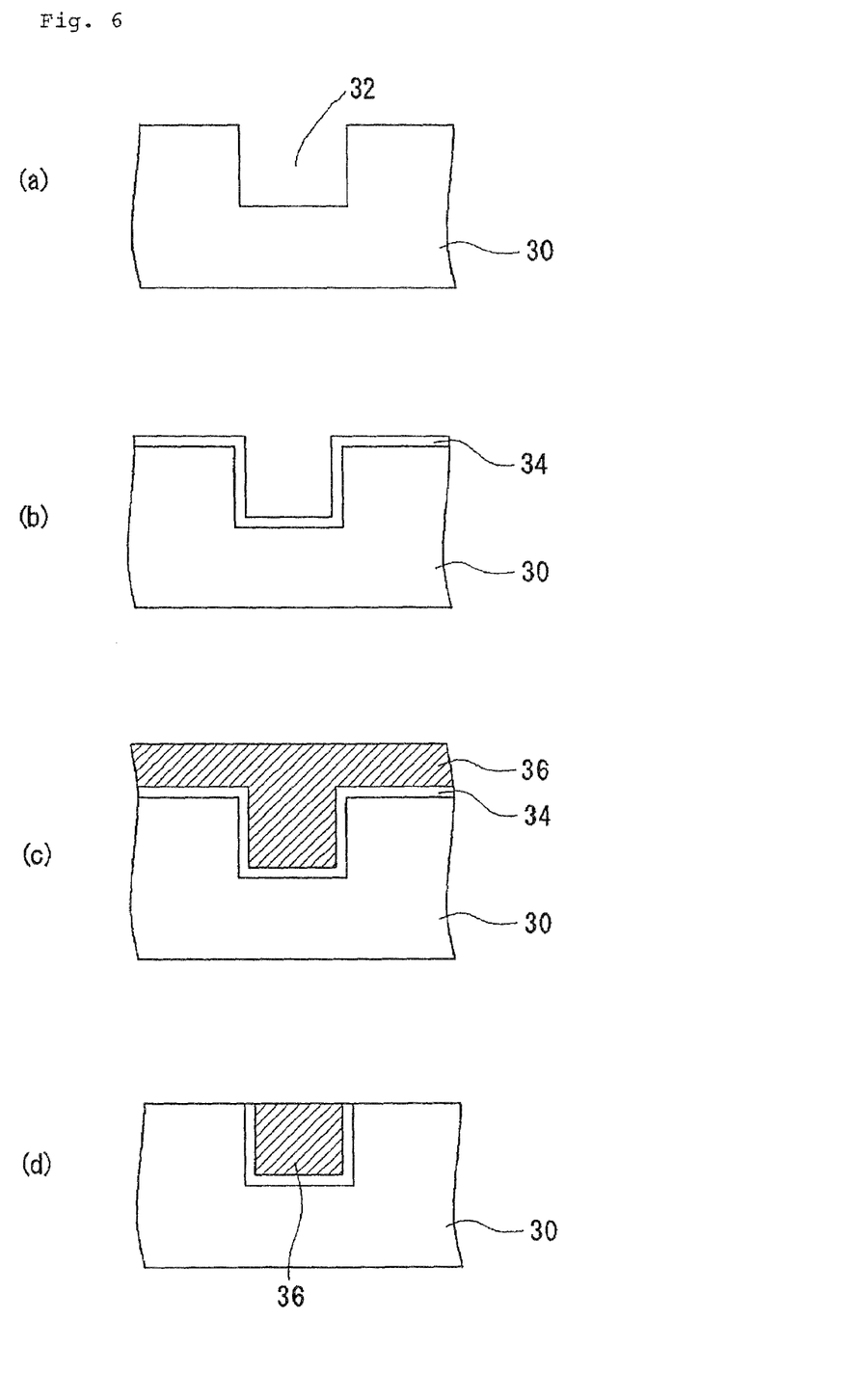
FIG. 6 is drawings showing steps for wiring production.

Next, as to a preferred embodiment of the present invention, a process for wiring producing is described by way of an example with referring to FIG. 6.

As shown in FIG. 6(a), an insulating layer 30 is formed on the device-formed surface of a substrate (not shown) and a wiring groove 32 is formed in the insulating layer 30. The insulating layer 30 may be, for example, a silicon oxide film functioning as an interlayer dielectric and may be formed by plasma CVD. The wiring groove 32 may be formed by etching. Although not shown, an anti-etching film may be formed between the insulating layer 30 and a film therebeneath. Thereby, the wiring groove 32 can be formed in a desired depth and a wiring having desired properties can be formed.

Then, as shown in FIG. 6(b), a barrier metal layer 34 is formed on the allover surface of substrate. The barrier metal layer 34 is formed by, for example, sputtering, and TiN, Ta, TaN, TaSiN, W, WN, etc. are used as the material for the film. Successively, as shown in FIG. 6(c), a copper-silver alloy layer 36 is formed on the barrier metal layer 34. The copper-silver alloy layer 36 is formed by plating, sputtering, CVD, etc. When the copper-silver alloy layer 36 is formed by plating, first, a seed metal film for growth of plating is deposited by sputtering. Successively, a copper-silver alloy layer 36 is formed by electroplating. In this case, the seed metal film may be formed with a material containing copper alone, or may be formed with a material containing silver in a high concentration. When the seed metal film is formed with a material containing silver in a high concentration or with a material containing copper and silver, plating may be conducted with a material containing copper alone. Then, an annealing treatment is conducted, whereby silver diffuses from the seed metal film into the plating and a relatively uniform copper-silver alloy film can be formed.

At this time, as shown in FIG. 2(a), metal contaminants such as copper, silver, copper-oxide, silver-oxide and the like adhere to the back side of substrate 10 in a large number. Hence, the substrate is washed using a removing solution and a semiconductor substrate cleaning solution, as mentioned previously.

Then, annealing is conducted at 400° C. for about 30 minutes. Thereby, grains constituting the copper-silver plating film grow, and the film comes to have a lower resistance and is stabilized.

Subsequently, as shown in FIG. 6(d), the unnecessary portions of the copper-silver alloy layer 36 and the barrier metal 34, outside the wiring groove 32 are removed by CMP to form a copper-silver alloy wiring. In CMP, metal contaminants composed of copper, silver, copper-oxide; silver-oxide, etc. adhere to the back side of semiconductor substrate in a large number. Therefore, as mentioned previously, the substrate is cleaned using a removing solution and a semiconductor substrate cleaning solution. The reason for conducting cleaning in this stage is that since a silicon oxide layer a silicon oxide layer is formed in the next step, cross-contamination for film formation apparatus need be prevented. Here, the cross-contamination refers to spread of contaminants between wafers, which occurs, for example, when metal contaminants adhering to a wafer scatter in an apparatus for treating other wafer and adhere to the other wafer, or when metal contaminants adhering to the back side of wafer adhere to the other wafer via the handler of the former wafer. The metal contaminants adhering to the back side of semiconductor substrate are removed substantially completely.

As described above, formation of a copper-silver alloy layer in the present embodiment can be conducted by, after a plating treatment, annealing the plating at a substrate temperature of 300° C. or more. Thus, plating, particularly electroplating is advantageous in that good coverage is obtained and it is relatively easy to conduct. When plating is used, however, it is necessary to conduct annealing at a high temperature of, for example, 300° C. or more. It is necessary for growth of grains constituting a plating layer as well as for lower resistance and stabilization. When a treatment at such a high temperature is conducted, however, there arises a problem that copper-based and silver-based metal contaminants remaining on the backside of substrate diffuse through the substrate. In the present embodiment, since metal contaminants can be removed substantially completely by a cleaning treatment using a removing solution, there is no diffusion of metal contaminants into the substrate and the above problem is solved.

In the present embodiment, the step for forming a copper-silver alloy wiring can be conducted by forming a copper-silver alloy layer and then removing the unnecessary portion of the copper-silver alloy layer. Removal of the unnecessary portion of the copper-silver alloy layer is conducted by CMP. In the step of CMP as well, copper-based and silver-based metal contaminants adhere to the back side of substrate. In the present embodiment, metal contaminants after CMP treatment can be removed as well substantially completely by a washing treatment using a removing solution; therefore, there is no diffusion of metal contaminants into substrate and the above problem is solved.

Further, since the removing solution used in the present embodiment has removability for both copper-based metal contaminants and silver-based metal contaminants, these two kinds of metal contaminants can be removed by one step at the same time operation in each treatment even when a copper-silver alloy wiring has been formed, and treatment steps can be shortened.

In the above embodiment, there was described a case in which a washing treatment using a removing solution was conducted after the formation of a copper-silver alloy layer and also after CMP. However, the removing solution used in the present embodiment is effective even when it is used only in the washing treatment after formation of a copper-silver alloy layer, and the washing treatment after CMP may be omitted.

EXAMPLES

In Table 1 are shown dissolution rates at which a silver layer or a copper layer dissolves in various solutions. As shown in Table 1, etching rates for copper and silver are relatively high when a mixed solution of ceric nitrate ammonium and nitric acid or nitric acid (70% by mass) is used.

TABLE 1

|  | Ag (μm/min) | Cu (μm/min) |
|---|---|---|
| Ceric nitrate ammonium + nitric acid | 1.57 | 0.75 |
| $HNO_3$ (70%) | 1.04 | 20 |
| $HNO_3$ (20%) | 0.01 | 4.5 |

Examples are shown below. In each Example, there is used, as a sample to be cleaned, a material obtained by adhering, to a silicon substrate, a copper-silver alloy (silver content therein: 5 atom %) by spin coating. By this treatment, it was possible to adhere, to the silicon substrate, a copper-silver alloy in the same condition as when metal contaminants appear on the area of a silicon substrate other than its device-formed area in forming a copper-silver alloy wiring on the substrate.

Reference Example 1

A sample was spin-washed for 30 seconds using various removing solutions. In this Reference Example, removing solutions containing nitric acid were used. The compositions of the removing solutions used are shown in Table 2. The amounts of copper contaminant and silver contaminant remaining on a semiconductor substrate after the removing treatment were measured by fluorescent X-ray analysis. The results are shown also in Table 2. As shown in Table 1, the etching rates of copper and silver by nitric acid (70% by mass) are relatively high at 1 μm/min or more. That is, nitric acid (70% by mass) can dissolve the copper or silver layer formed in a process for semiconductor device production. Nevertheless, the removing solutions having compositions shown in Table 2 were unable to remove copper or silver.

TABLE 2

$\times 10^{10}$ atoms/cm$^2$

| Removing solution | Ag contamination | Cu contamination |
|---|---|---|
| Before cleaning | 43297 | 10951 |
| (a) $HNO_3$ (1.4%) | 59218 | 29 |
| (b) $HNO_3$ (7%) | 54617 | 64 |
| (c) $HNO_3$ (20%) | 15053 | 25 |
| (d) $HNO_3$ (35%) | 4068 | 21 |
| (e) $HNO_3$ (70%) | 1029 | 3 |
| (f) $HNO_3:H_2O_2:H_2O$ = 1:1:10 | 1519 | 6 |
| (g) $HNO_3:H_2O_2:H_2O$ = 1:1:2 | 812 | 2 |

Reference Example 2

A sample was spin-washed for 30 seconds using various removing solutions. In this Reference Example, removing solutions containing sulfuric acid were used. The compositions of the removing solutions used are shown in Table 3. The amounts of copper contaminant and silver contaminant remaining on a semiconductor substrate after the removing treatment were measured by fluorescent X-ray analysis. The results are shown also in Table 3. Copper could not be removed with the removing solutions having compositions shown in Table 3, other than those shown in (i) and (k); and silver could not be removed with any removing solution.

TABLE 3

$\times 10^{10}$ atoms/cm$^2$

| Removing solution | Ag contamination | Cu contamination |
|---|---|---|
| Before washing | 43297 | 10951 |
| (h) $H_2SO_4:H_2O$ = 2:50 | 6496 | 14 |
| (i) $H_2SO_4:H_2O_2:H_2O$ = 2:1:50 | 564 | ND |
| (j) $H_2SO_4:H_2O_2:HF:H_2O$ = 2:1:1:50 | 37320 | 117 |
| (k) $H_2SO_4:H_2O_2:HF:H_2O$ = 2:1:1:10 | 1253 | ND |

Reference Example 3

A sample was spin-washed for 30 seconds using various removing solutions. In this Reference Example, removing solutions containing hydrofluoric acid were used. The compositions of the removing solutions used are shown in Table 4. The amounts of copper contaminant and silver contaminant remaining on a semiconductor substrate after the removing treatment were measured by fluorescent X-ray analysis. The results are shown also in Table 4. Copper could not be removed with the removing solutions having compositions shown in Table 4, other than that shown in (n); and silver could not be removed with any removing solution.

TABLE 4

$\times 10^{10}$ atoms/cm$^2$

| Removing solution | Ag contamination | Cu contamination |
|---|---|---|
| Before washing | 43297 | 10951 |
| (l) $HF:HNO_3:H_2O$ = 1:5:20 | 54918 | 202 |
| (m) $HF:H_2O_2:H_2O$ = 1:5:100 (FPM) → $HF:HNO_3:H_2O$ = 1:5:20 | 5101 | 0 |
| (n) $HF:H_2O_2:H_2O$ = 1:5:100 (FPM) | 2340 | ND |

Example 1

A sample was spin-washed for 30 seconds using a removing solution. In this Example, a removing solution containing ceric nitrate ammonium was used. The composition of each removing solution used is shown in Table 5. The amounts of silver contaminant and copper contaminant remaining on the semiconductor substrate after removing treatment and the amount of cerium (which was a residue of the removing solution) were measured by fluorescent X-ray analysis. The results are shown also in Table 5. With the removing solution having a composition shown in Table 5, both copper and silver were washed at such a cleanness that they could not be detected. However, the cerium contained in the removing solution remained.

TABLE 5

| | $\times 10^{10}$ atoms/cm$^2$ | | |
|---|---|---|---|
| Removing solution | Ag contamination | Cu contamination | Ce contamination |
| Before washing | 43297 | 10951 | |
| (o) Ceric nitrate ammonium | ND | ND | ND |

Example 2

A sample was spin-washed for 30 seconds using a removing solution. The semiconductor substrate after the removing treatment was immersed in a semiconductor substrate cleaning solution containing diluted hydrofluoric acid (DHF), for 30 seconds. The amounts of silver contaminant and copper contaminant remaining on the semiconductor substrate after cleaning treatment and the amount of cerium (which was a residue of the removing solution) were measured by fluorescent X-ray analysis. The results are shown in Table 6. By the above treatment, all of copper, silver and cerium were washed at such a cleanness that they could not be detected.

TABLE 6

| | $\times 10^{10}$ atoms/cm$^2$ | | |
|---|---|---|---|
| Removing solution + semiconductor substrate cleaning solution | Ag contamination | Cu contamination | Ce contamination |
| Before cleaning | 43297 | 10951 | |
| (p) Ceric nitrate ammonium → DHF | ND | ND | ND |

Example 3

Removing treatments and cleaning treatments were conducted under the conditions shown in Table 7. Each treatment was conducted for 30 seconds except those mentioned otherwise. The amounts of silver contaminant and copper contaminant remaining on the semiconductor substrate after washing treatment and the amount of cerium (which was a residue of the removing solution) were measured by fluorescent X-ray analysis. The results are shown also in Table 7. By the above treatments, all of copper, silver and cerium were washed at such a cleanness that they could not be detected.

TABLE 7

| | $\times 10^{10}$ atoms/cm$^2$ | | |
|---|---|---|---|
| Removing solution + semiconductor substrate cleaning solution | Ag contamination | Cu contamination | Ce contamination |
| Before cleaning | 43297 | 10951 | |
| (q) Ceric nitrate ammonium → HF (15 seconds) → DHF | ND | ND | ND |
| (r) Ceric nitrate ammonium → HNO$_3$/DHF | ND | ND | ND |
| (s) Ceric nitrate ammonium(15 seconds)→ HNO$_3$/DHF | ND | ND | ND |

As described above, even solutions (e.g. nitric acid of 70% by mass) showing high etching rates toward copper and silver and capable of dissolving a copper or silver layer formed in a process for semiconductor device production were unable to remove copper- or silver-containing metal contaminants adhering to a semiconductor substrate. In the present Examples, however, dissolution and removal of metal contaminants and effective prevention of readhesion of the removed metal contaminants were possible with removing solutions containing ceric nitrate ammonium.

The present invention has been described above based on Examples. The embodiments shown are illustrative and it will be understood by those skilled in the art that various modifications are possible in their constituents and the combination of various treatment steps and such modifications as well fall in the scope of the present invention.

For example, while in the above Examples, removal of metal contaminants was described, the above-mentioned removing solutions can be used also as an etching solution for copper- or silver-containing metals.

Further, like the copper-silver alloy in the above Examples, palladium-containing metals could be removed well using the same removing solutions.

Furthermore, while in the above Examples, ceric nitrate ammonium was used as a removing solution, metal contaminants could be removed efficiently also by using a removing solution containing periodic acid or a hypochlorite both of relatively high oxidation-reduction potential.

According to the removing solution of the present invention and the cleaning method for semiconductor substrate using the removing solution, silver-based and copper-based metal contaminants adhering to a semiconductor substrate can be dissolved and removed sufficiently and, moreover, readhesion of the removed metal contaminants can be prevented effectively. Therefore, the removing solution and the washing method can be suitably applied to steps having strict requirements for contamination prevention, such as wiring in a semiconductor device requiring high-speed operability.

What is claimed is:

1. A cleaning method for a semiconductor substrate, the method comprising the steps of:
    forming a metal layer including palladium on a semiconductor substrate; and
    removing the metal layer using a removing solution containing a cerium (IV) nitrate salt,
    wherein said palladium is contained in a treating solution used as a metal cap before plating.

2. The cleaning method for the semiconductor substrate as claimed in claim 1, further comprising the step of:
    washing the semiconductor substrate using a cleaning solution containing hydrofluoric acid after removing the metal layer.

3. The cleaning method for the semiconductor substrate as claimed in claim 2,
    wherein the content of the hydrofluoric acid contained in the cleaning solution is 0.5 to 5 weight %.

4. The cleaning method for the semiconductor substrate as claimed in claim 1,
    wherein the cerium (IV) nitrate salt consists of a cerium (IV) nitrate ammonium.

5. The cleaning method for the semiconductor substrate as claimed in claim 4,
    wherein the cerium (IV) nitrate ammonium is contained in the removing solution at the content of 5 to 30 weight %.

6. The cleaning method for the semiconductor substrate as claimed in claim 1,
wherein the removing solution containing the cerium (IV) nitrate salt further contains at least one acid selected from the group consisting of nitric acid, acetic acid, iodic acid and chloric acid.

7. The cleaning method for the semiconductor substrate as claimed in claim 6 wherein the total content of the acid contained in the removing solution is 1 to 30 weight %.

8. The cleaning method for the semiconductor substrate as claimed in claim 1,
wherein the removing solution containing the cerium (IV) nitrate salt further contains nitric acid.

* * * * *